United States Patent
Wilby

(10) Patent No.: US 8,454,805 B2
(45) Date of Patent: Jun. 4, 2013

(54) METHOD OF DEPOSITING AMORPHUS ALUMINIUM OXYNITRIDE LAYER BY REACTIVE SPUTTERING OF AN ALUMINIUM TARGET IN A NITROGEN/OXYGEN ATMOSPHERE

(75) Inventor: Anthony Wilby, Bristol (GB)

(73) Assignee: SPTS Technologies Limited, Newport, Wales (GB)

( * ) Notice: Subject to any disclaimer, the term of this patent is extended or adjusted under 35 U.S.C. 154(b) by 208 days.

(21) Appl. No.: 12/934,276

(22) PCT Filed: Mar. 20, 2009

(86) PCT No.: PCT/GB2009/000750
§ 371 (c)(1),
(2), (4) Date: Oct. 28, 2010

(87) PCT Pub. No.: WO2009/118514
PCT Pub. Date: Oct. 1, 2009

(65) Prior Publication Data
US 2011/0042200 A1    Feb. 24, 2011

Related U.S. Application Data

(60) Provisional application No. 61/045,567, filed on Apr. 16, 2008.

(30) Foreign Application Priority Data

Mar. 25, 2008    (GB) .................................. 0805328.2

(51) Int. Cl.
*C23C 14/34*    (2006.01)

(52) U.S. Cl.
CPC ...................................... *C23C 14/34* (2013.01)
USPC ............ 204/192.12; 204/192.15; 204/192.17; 204/192.22

(58) Field of Classification Search
CPC ........................................................ C23C 14/34
USPC .............. 204/192.12, 192.15, 192.22, 192.17
See application file for complete search history.

(56) References Cited

U.S. PATENT DOCUMENTS
6,576,482 B1 *    6/2003    Aggarwal et al. ................. 438/3
2005/0017319 A1    1/2005    Manabe et al.
(Continued)

FOREIGN PATENT DOCUMENTS
EP    0434300 A1    6/1991
WO    98/37254 A3    8/1998
WO    02/0099155 A1    12/2002

OTHER PUBLICATIONS

Bray et al. "Aluminum Oxynitride Dielectrics for High Power, Wide Temperature Capcaitor Applications", CARTS USA 2006, Apr. 3-6, 2006, Orlando, FL.*

(Continued)

*Primary Examiner* — Rodney McDonald
(74) *Attorney, Agent, or Firm* — Volentine & Whitt, PLLC

(57) ABSTRACT

A method of depositing an amorphous layer of AlON includes providing an aluminum sputter target in a chamber, exposing the target and chamber to $O_2$ to saturate the exposed surfaces with oxygen, introducing a substrate into the chamber in an atmosphere containing at least nitrogen and oxygen, and sputtering the target in the nitrogen and oxygen atmosphere to deposit an amorphous AlON film.

20 Claims, 5 Drawing Sheets

U.S. PATENT DOCUMENTS

2005/0037605 A1 2/2005 Kim et al.
2006/0027450 A1 2/2006 Hegemann et al.
2007/0034892 A1* 2/2007 Song .............................. 257/103

OTHER PUBLICATIONS

Notification of Transmittal of the International Search Report and the Written Opinion of the International Searching Authority.
Ianno N J et al: "Aluminum oxynitride coatings for oxidation resistance of epoxy films" Surface & Coatings Technolgy Elsevier Switzerland, vol. 155, No. 2-3, Jun. 17, 2002, pp. 130-135.
Waite et al: "Target poisoning during reactive sputtering of silicon with oxygen and nitrogen" Materials Science and Engineering B, Elsevier Sequoia, Lausanne, CH, vol. 140, No. 1-2, May 25, 2007, pp. 64-68.
Sproul et al: "Control of reactive sputtering processes" Thin Solid Films, Elsevier-Sequoia S.A. Lausanne, CH, vol. 491, No. 1-2, Nov. 22, 2005, pp. 1-17.
Sproul W D et al: "Multi-level control for reactive sputtering" Annual Technical Conference Proceedings Society of Vacuum Coaters, Alburquerque, NM, US, Apr. 13, 2002, pp. 11-15.
Dehuang W et al: "An aluminum oxynitride film" Thin Solid Films, Elsevier-Sequoia S.A. Lausanne, CH, vol. 198, No. 1-2, Mar. 20, 1991, pp. 207-210.

* cited by examiner

METHOD OF DEPOSITING AMORPHUS ALUMINIUM OXYNITRIDE LAYER BY REACTIVE SPUTTERING OF AN ALUMINIUM TARGET IN A NITROGEN/OXYGEN ATMOSPHERE

This invention relates to a method of depositing an amorphous layer of AlON.

It is well known to deposit AlN layers for a variety of purposes by sputtering an aluminium target in a nitrogen atmosphere. Such deposited layers are crystalline in nature and whilst this is acceptable for a number of purposes, this crystallinity has precluded attempts to use this material as a hard mask in methods of etching. This is because any roughness in an opening in the mask will be replicated in the etched feature.

The Applicants have appreciated that this problem could be overcome if it were possible to repeatedly form an amorphous layer whilst retaining the desirable characteristics, such as high resistance to etch an thermodynamic stability, of the AlN. In an article entitled "Phase Evolution in Aluminium Nitride Films on Si(100) Prepared by Radio Frequency Magnetron Sputtering" by Choi et al in thin solid films 384 (2001) 166-172 a method of depositing thin aluminium nitride films is described. The authors are seeking to deposit a poly-crystalline AlN film but noted that initially, at the film/substrate interface area, an apparently amorphous AlN layer was formed having a small amount of oxygen, the oxygen having apparently come from the substrate as the sputtering took place in a gas mixture of argon and nitrogen. From the text it would appear that the oxygen at this interface does not exceed 10% and probably just causes local disruption of the lattice. As the film deposited by Choi et al is essentially poly-crystalline, it would not be suitable for use as a hard mask.

From one aspect the invention consists in a method of depositing an amorphous layer of AlON including:
 (a) providing an aluminium sputter target in a chamber;
 (b) exposing the target in the chamber to $O_2$ to saturate the exposed surfaces with oxygen;
 (c) introducing a substrate into the chamber in an atmosphere containing at least nitrogen and oxygen; and
 (d) sputtering the target in the nitrogen and oxygen atmosphere to deposit an amorphous AlON film.

As will be demonstrated below the deposition in this way of a bulk film is quite different from the process described in Choi and, in particular, it is not sufficient simply to have oxygen in the chamber; preconditioning of the chamber is essential.

Conveniently the substrate may have a seed layer, which is preferably either AlON or $Al_2O_3$. In either case the seed layer may improve the amorphous nature of the interface.

It is preferred that oxygen is flowed into the chamber in step (c) at a rate of 5-20 sccm.

The sputtering step may take place using a pulsed DC diode configuration and additionally or alternatively an inert gas, such as argon, may be used as the sputter gas.

The substrate may be supported on a platen, in which case the platen may be maintained at a temperature in the range of around 50 to around 400° C.

The duration of step (b) will depend on the chamber geometry but may last for between around 40 to 200 seconds and preferably last for around 60 seconds.

The oxygen content of the as deposited film may be around at least 25 at % and less than around 40 at %. The deposited layer may form a hard mask and the substrate may be or include a semi-conductor wafer.

Although the invention has been defined above, it is to be understood that it may include any inventive combination of the features set out above or in the following description.

The invention may be performed in various ways and specific embodiments will now be described with reference to the accompanying drawings, in which.

Figure 5:
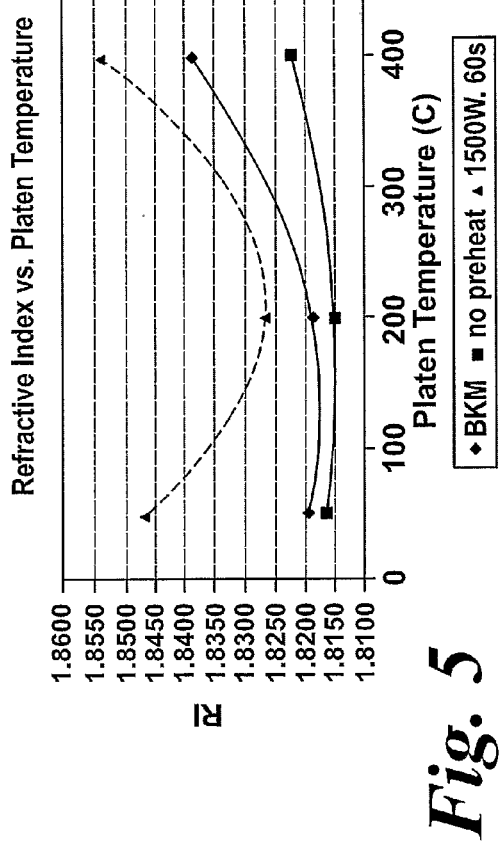
Figure 6:
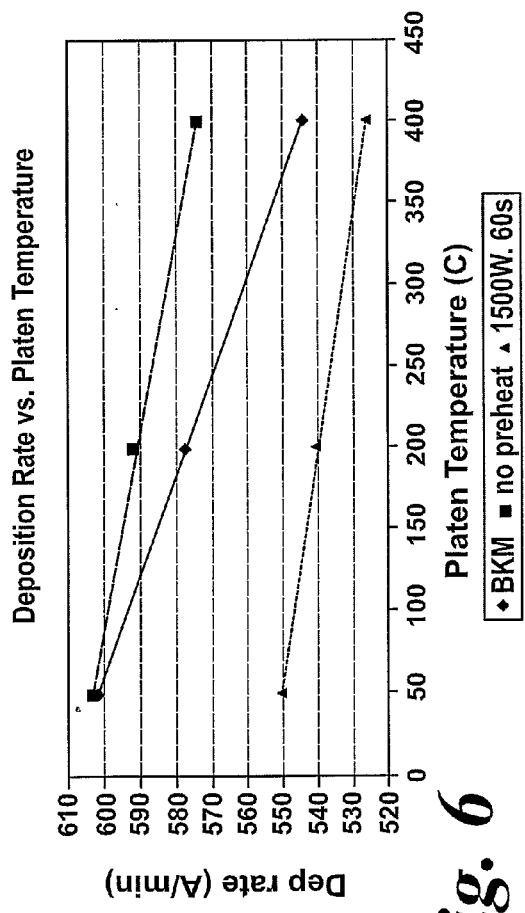
Figure 7:
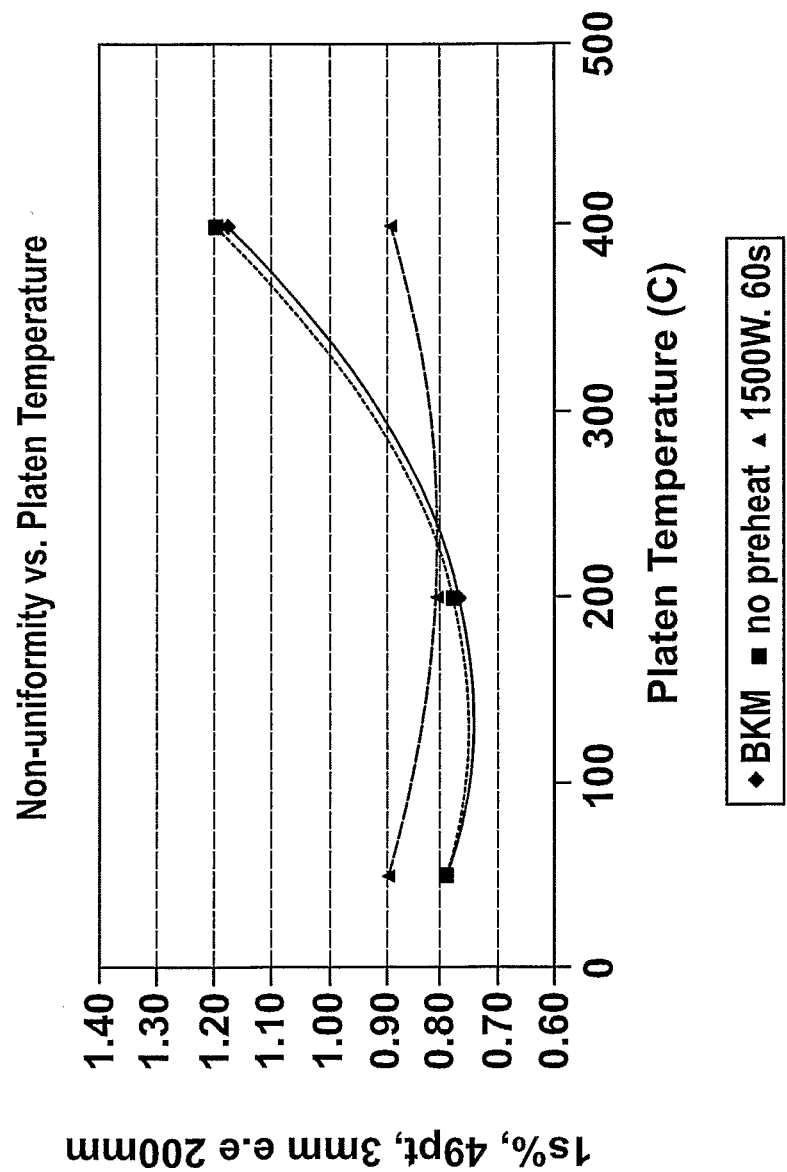
Figure 8:
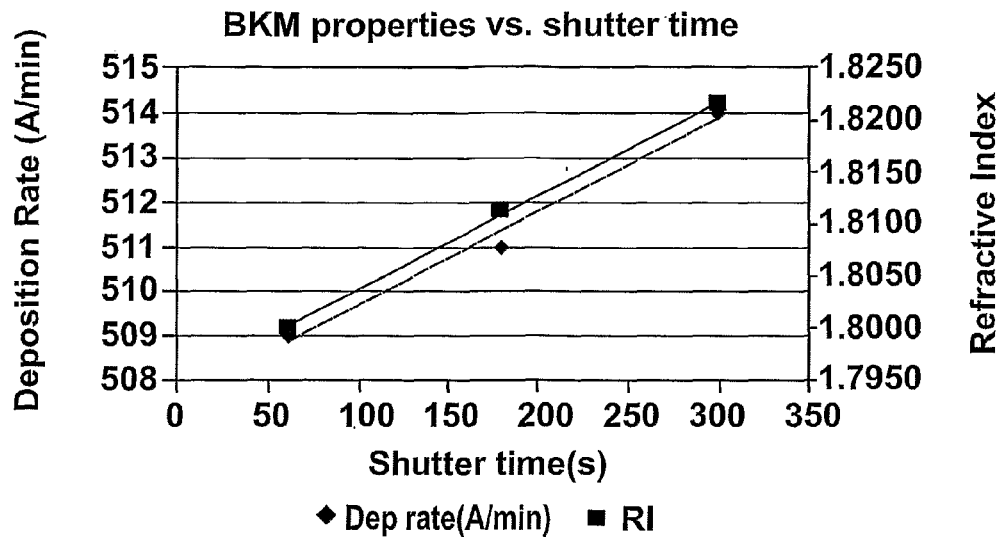

FIG. 5 plots refractive index against platen temperature;

FIG. 6 plots deposition rate against platen temperature;

FIG. 7 plots non-uniformity against platen temperature;

FIG. 8 plots deposition rates and refractive index against shutter time; and

Figure 9:
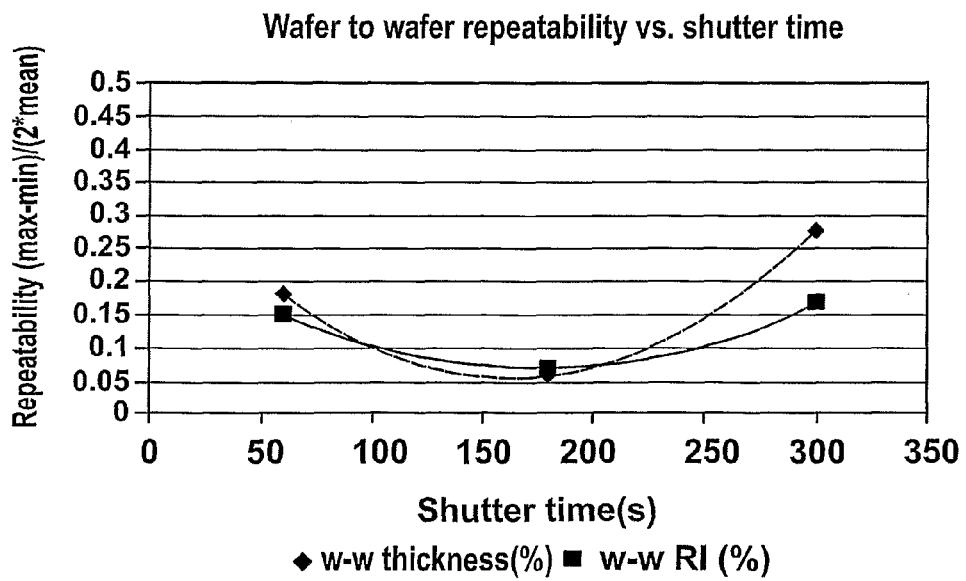

FIG. 9 plots wafer to wafer repeatability against shutter time.

Figure 1:
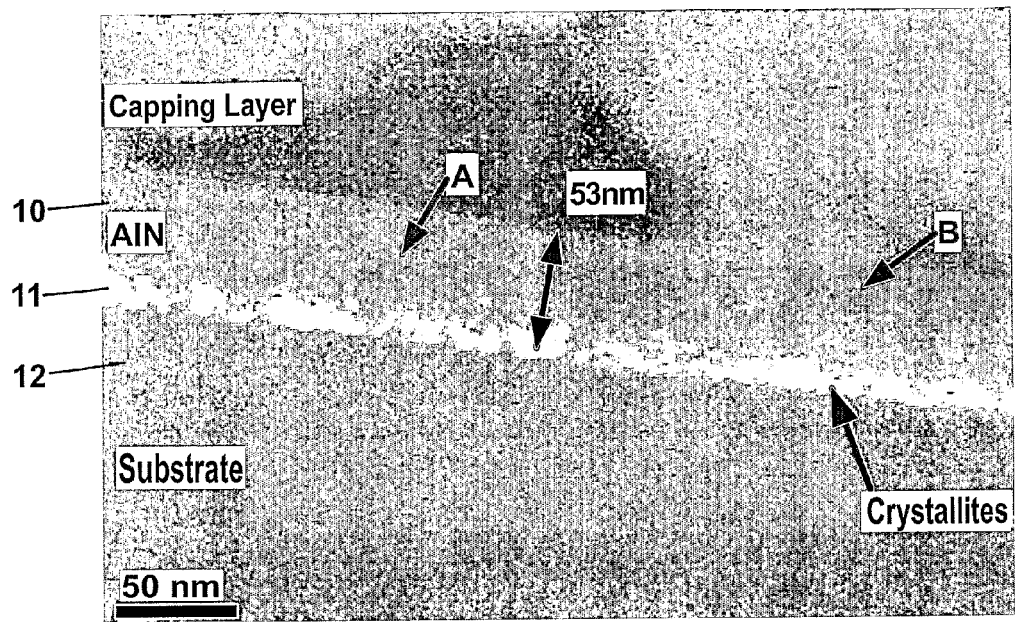
FIG. 1 is a transmission electron micrograph (TEM) through a test wafer on which the Applicants have sought to deposit an amorphous AlN layer.

The layer 10 in FIG. 1 has been deposited by placing a wafer in a chamber having an aluminium target and sputtering that target with argon gas whilst providing a nitrogen and oxygen atmosphere within the chamber. As can be seen crystallites 11 form at the interface between the layer 10 and the substrate 12 on which the layer is deposited. For the purposes of this specification an amorphous layer is one in which the crystallinity is less than 5 nm, which is the dimension at which the crystallinity does not affect the structure of, for example, vias having dimensions at around 90 nm.

Figure 2:
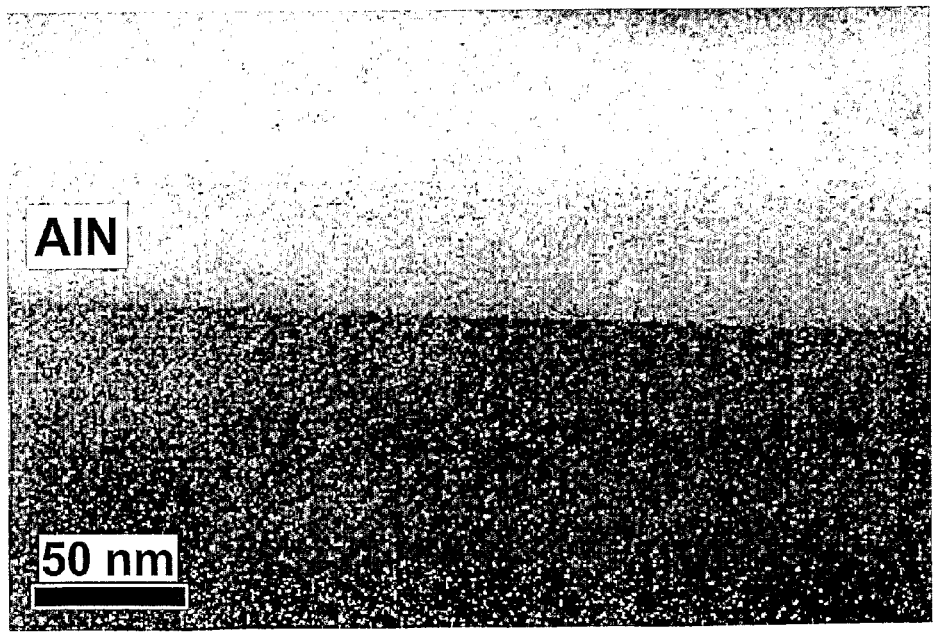
FIG. 2 is an equivalent TEM for a layer deposited in accordance with an alternate method.

The difference between this process and the process in which the layer 10 of FIG. 2 was deposited, is that prior to the sputtering process, oxygen was flowed into the chamber to saturate the exposed surfaces of the chamber and the target. It will be seen that no crystallites are formed and the Applicants believe that this is because in the first process the oxygen preferentially deposited on the metal surfaces within the chamber before combining fully with the sputtered aluminium and the nitrogen.

It will be understood that the process of FIG. 1 may be acceptable, where large dimension features are being formed in the hard mask and subsequently the substrate, but that the method of FIG. 2 is much preferred.

This conditioning step would typically be performed with the shutter extending over a platen in the chamber, on which a wafer is deposited for processing. As will be seen below, the timing of this shutter step can be optimised. Depending on the nature of the process being performed, and any other intermediate processes being performed in the chamber, it may not be necessary to perform the conditioning or shutter step between every wafer.

Figure 3:
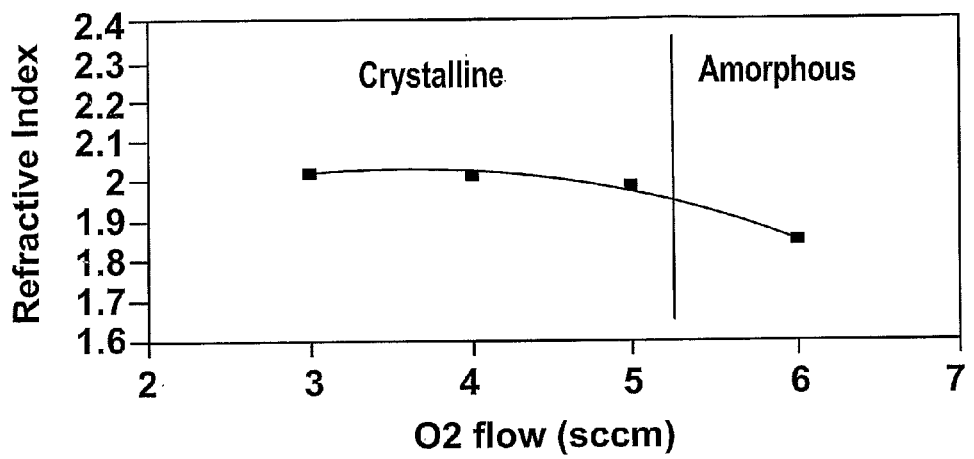
FIG. 3 is a graph showing the relationship between refractive index and $O_2$ flow in a process according to the invention and illustrates the boundary between crystalline and amorphous layers in relation to refractive index.
Figure 4:
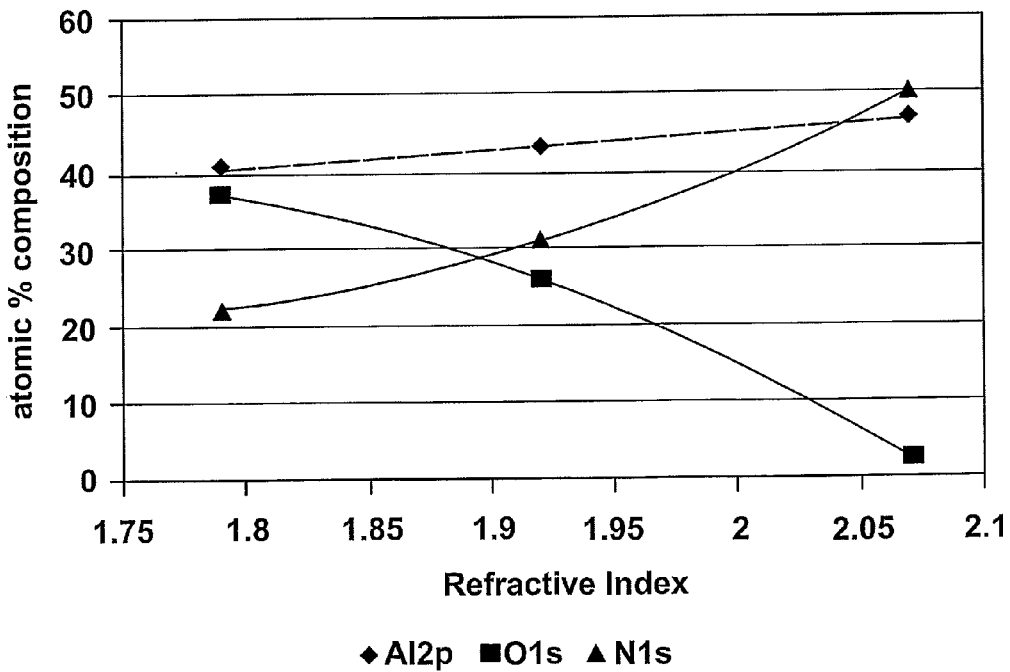
FIG. 4 illustrates the refractive index of layers of various compositions.

As can be seen in FIG. 3, the refractive index is indicative of the texture of the film and AlN becomes amorphous around about a refractive index of 1.9. This, in the particular experiment indicated in the heading to the graph happens at an oxygen flow rate of around 5. sccm. From FIG. 4, it can be seen that this transition occurred when the layer had an atomic percent of $O_2$ of around 25% and it is believed that for hard mask purposes, at least, this level of oxygen content would be required.

FIG. 5 indicates that for the best known method (bkm) there is a relatively flat temperature window around 50° C. and around 200° C., whilst FIG. 6 shows that there is an adequate deposition rate in this window. FIG. 7 indicates that the uniformity is acceptable up to at least 400° C.

FIG. 8 plots shutter time against deposition rate and refractive index and it will be seen that these are acceptable at least in the window 50° C. to 200° C. FIG. 9 indicates that the repeatability, wafer to wafer, is also good within that shutter window.

The Applicants have therefore established that it is possible to provide good repeatable amorphous layers using the method of the invention and if the oxygen content is taken up to the surprisingly high figure of around 25 at, the texture can be sufficiently good to enable the film to be used as a hard mask even with the very small features that currently are required to be etched.

The Applicants have also determined that the interface can be improved if there is a seed layer of AlON or $Al_2O_3$ or similar amorphous interface The target is preferably first cleaned, for example by an argon plasma. Optionally, it may then be nitrided by an argon/nitrogen plasma. The oxygen may be supplied in an argon/nitrogen plasma.

One effective process is as follows:
1. Shutter the wafer support
2. Clean the target and chamber by running an argon plasma for 40 s, at 20 kw, 200 C. with an argon flow rate of 100 sccm.
3. Condition the chamber for 20 seconds, with 6 kw power, at 20° C., 20 sccm Ar, 100 sccm $N_2$ and 7 sccm $O_2$.
4. Heat the wafer for 30 s at 1500 w
5. 5. Deposit AlON for 48 s, at 6 kw, 200 C., 20 sccm Ar, 100 sccm $N_2$ and 7 sccm $O_2$
6. Cool the wafer for 60 s prior to reinsertion in the cassette.

If starting with a clean conditioned chamber the steps can be run in the order: 4, 5, 1, 2, 3, 6. It has been found that the cleaning step should preferably be over 10 s, for example in the range 30 to 50 s.

The invention claimed is:

1. A method of forming an amorphous layer of AlON comprising steps of:
   (a) providing an aluminium sputter target in a chamber;
   (b) saturating exposed surfaces of the target and exposed inner surfaces of the chamber with oxygen;
   (c) introducing a substrate into the chamber in an atmosphere containing at least nitrogen and oxygen; and
   (d) sputtering the target in the nitrogen and oxygen atmosphere to deposit an amorphous AlON film on the substrate.

2. A method as claimed in claim 1, further comprising a step of cleaning the target between steps (a) and (b).

3. A method as claimed in claim 2 wherein the cleaning step comprises exposing the target to an Argon plasma.

4. A method as claimed in claim 2, wherein the target is exposed to an argon/nitrogen plasma between the cleaning step and step (b).

5. A method as claimed in claim 1, wherein in step (b) the oxygen is supplied in an argon/nitrogen plasma.

6. A method as claimed claim 1, wherein the substrate has a seed layer.

7. A method as claimed in claim 6, wherein the seed layer is AlON or $Al_2O_3$.

8. A method as claimed in claim 1, wherein oxygen is flowed into the chamber in step (c) at a rate of 5-20 sccm.

9. A method as claimed in claim 1, wherein the sputtering step takes place using a pulsed DC diode configuration.

10. A method as claimed in claim 1, wherein argon is used as a sputter gas in step (d).

11. A method as claimed claim 1, wherein the substrate is supported on a platen and the platen is maintained at temperature in the range around 50° C. to around 400° C.

12. A method as claimed in claim 1 wherein step (b) lasts for between around 40 and 200 seconds.

13. A method as claimed in claim 12, wherein step (b) lasts for around 60 seconds.

14. A method as claimed in claim 1, wherein the oxygen content of the deposited film is at least around 25 at % and less than around 40 at %.

15. A method as claimed in claim 1, wherein the layer is a hard mask.

16. A method as claimed in claim 15, wherein the substrate is or includes a semi-conductor wafer.

17. A sputtering method comprising:
    providing a sputter target comprising Al in a chamber, wherein the target has a surface exposed in the chamber and the chamber has exposed inner metal surfaces;
    saturating the exposed surfaces of the target and chamber with oxygen; and
    forming a layer comprising amorphous AlON on a substrate in the chamber by sputtering the target in an atmosphere containing nitrogen and oxygen after the surfaces of the target and chamber have been saturated with oxygen.

18. The method as claimed in claim 17, further comprising cleaning the target with an argon plasma before the target is sputtered.

19. A method as claimed in claim 18, further comprising nitriding the target after the target has been cleaned with the argon plasma and before the target is sputtered.

20. A method as claimed in claim 17, wherein the saturating of the surfaces of the target and chamber comprises introducing $O_2$ into the chamber.

* * * * *